United States Patent
Takai

(10) Patent No.: US 10,153,189 B2
(45) Date of Patent: Dec. 11, 2018

(54) CARRIER BUFFERING DEVICE AND BUFFERING METHOD

(71) Applicant: Murata Machinery, Ltd., Kyoto-shi, Kyoto (JP)

(72) Inventor: Kaname Takai, Inuyama (JP)

(73) Assignee: Murata Machinery, LTD. (JP)

(*) Notice: Subject to any disclaimer, the term of this patent is extended or adjusted under 35 U.S.C. 154(b) by 0 days.

(21) Appl. No.: 15/315,675

(22) PCT Filed: Apr. 30, 2015

(86) PCT No.: PCT/JP2015/062938
§ 371 (c)(1),
(2) Date: Dec. 1, 2016

(87) PCT Pub. No.: WO2015/194264
PCT Pub. Date: Dec. 23, 2015

(65) Prior Publication Data
US 2017/0200626 A1    Jul. 13, 2017

(30) Foreign Application Priority Data
Jun. 19, 2014  (JP) ................................ 2014-126012

(51) Int. Cl.
*H01L 21/677*  (2006.01)

(52) U.S. Cl.
CPC .. *H01L 21/67733* (2013.01); *H01L 21/67736* (2013.01); *H01L 21/67769* (2013.01)

(58) Field of Classification Search
CPC ......... H01L 21/67733; H01L 21/67739; H01L 21/67766; H01L 21/67775
(Continued)

(56) References Cited

U.S. PATENT DOCUMENTS 8,123,456 B2 * 2/2012 Wakabayashi .... H01L 21/67733
                                                      414/281
8,915,690 B2 * 12/2014 Ota .................. H01L 21/67733
                                                      414/275
(Continued)

FOREIGN PATENT DOCUMENTS

JP    2009-059775 A    3/2009
JP    2010-016387 A    1/2010
(Continued)

OTHER PUBLICATIONS

English language translation of International Search Report dated Jul. 21, 2015 issued in corresponding PCT application PCT/JP2015/062938.

(Continued)

*Primary Examiner* — Kaitlin S Joerger
(74) *Attorney, Agent, or Firm* — DLA Piper LLP (US)

(57) ABSTRACT

Without a lateral transfer mechanism in a local vehicle, the buffering capacity of a temporary storage apparatus is increased. The temporary storage apparatus stores carriers temporarily between overhead travelling vehicles and load ports. A travelling rail for the local vehicle is provided to allow the local vehicle to run below the travelling rail for the overhead vehicles and over the load ports. A slidable buffer slidable between a position under the travelling rail for the local vehicle and a position shifted laterally and a controller for controlling the local vehicle and the slidable buffer are provided, and the local vehicle waits at a position separated from an area over the load ports.

8 Claims, 12 Drawing Sheets

(58) Field of Classification Search
USPC .......................................................... 414/281
See application file for complete search history.

(56) References Cited

U.S. PATENT DOCUMENTS

| | | | | |
|---|---|---|---|---|
| 9,004,840 | B2* | 4/2015 | Kinugawa | H01L 21/67733 414/281 |
| 9,263,311 | B2* | 2/2016 | Ota | B65G 1/0457 |
| 9,520,313 | B2* | 12/2016 | Ota | H01L 21/67733 |
| 9,548,230 | B2* | 1/2017 | Iwasaki | H01L 21/67733 |
| 9,698,036 | B2* | 7/2017 | Aguilar | H01L 21/6773 |
| 2008/0240892 | A1 | 10/2008 | Courtois et al. | |
| 2010/0003111 | A1 | 1/2010 | Yeo et al. | |
| 2010/0290873 | A1* | 11/2010 | Bonora | H01L 21/67766 414/267 |
| 2012/0114453 | A1 | 5/2012 | Ota et al. | |
| 2012/0263562 | A1* | 10/2012 | Mizokawa | H01L 21/67733 414/618 |
| 2012/0275886 | A1 | 11/2012 | Ota | |
| 2014/0286733 | A1* | 9/2014 | Ogura | H01L 21/67775 414/217.1 |
| 2015/0170946 | A1* | 6/2015 | Ota | H01L 21/67733 212/276 |
| 2015/0203333 | A1* | 7/2015 | Ota | H01L 21/67288 212/276 |
| 2015/0329298 | A1* | 11/2015 | Ito | B65G 1/0464 414/222.07 |
| 2017/0186639 | A1* | 6/2017 | Takai | H01L 21/67769 |
| 2017/0194182 | A1* | 7/2017 | Takai | H01L 21/67733 |
| 2017/0200625 | A1* | 7/2017 | Takai | H01L 21/67733 |

FOREIGN PATENT DOCUMENTS

| | | |
|---|---|---|
| JP | 2012-111635 A | 6/2012 |
| JP | 2012-114406 A | 6/2012 |

OTHER PUBLICATIONS

International Preliminary Report on Patentability dated Dec. 20, 2016 in PCT Application No. PCT/JP2015/062938 filed Apr. 30, 2015.

* cited by examiner

F I G. 5
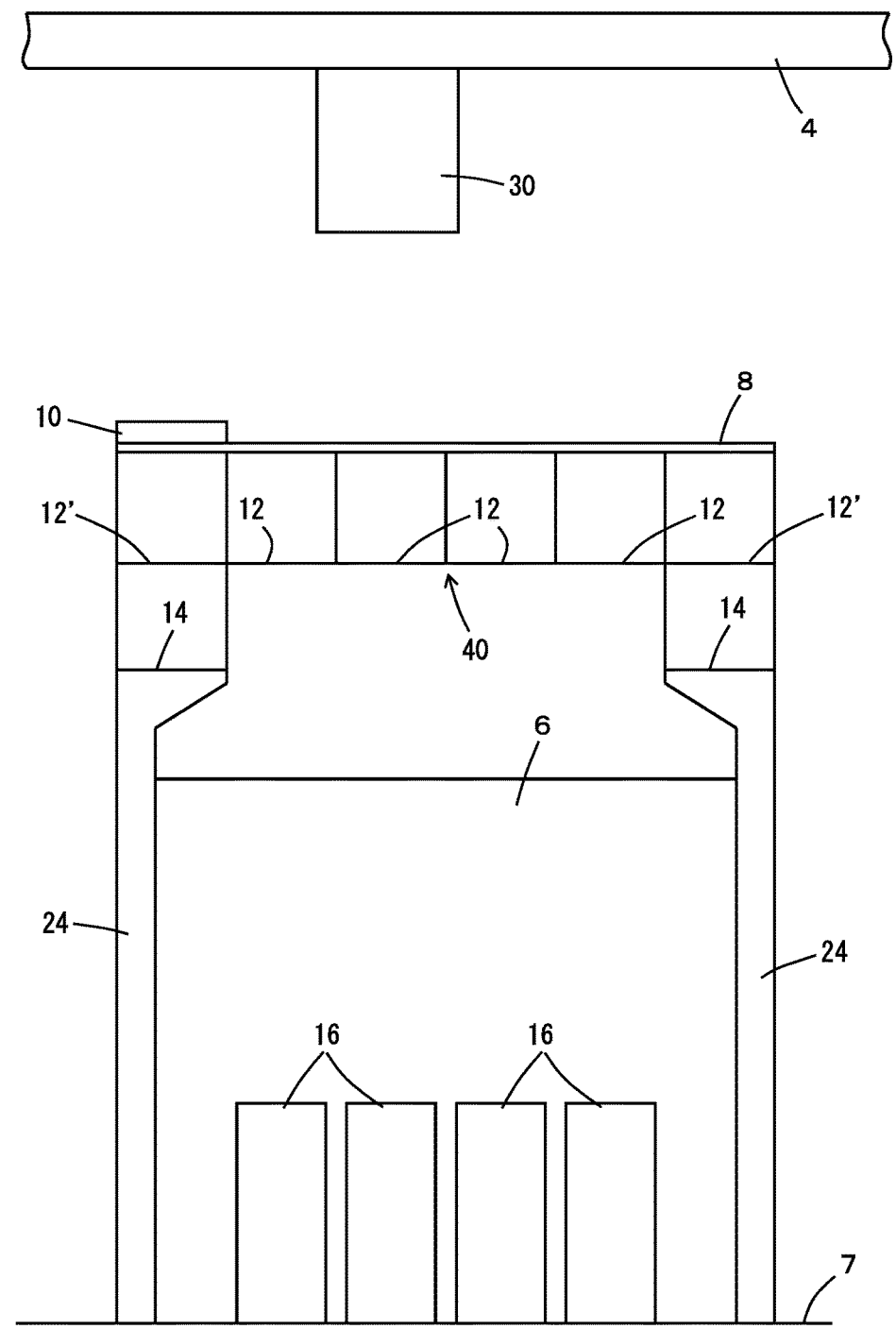

CARRIER BUFFERING DEVICE AND BUFFERING METHOD

CROSS REFERENCE TO RELATED APPLICATIONS

This application is a national stage of international application no. PCT/JP2015/062938, filed on Apr. 30, 2015, and claims the benefit of priority under 35 USC 119 of Japanese application no. 2014-126012, filed on Jun. 19, 2014, both of which are incorporated herein by reference in their entirety.

BACKGROUND OF THE INVENTION

Field of the Invention

The present invention relates to temporarily storing a carrier in which semiconductor wafers or the like are housed.

Description of the Related Art

In order to improve the utilisation rate of semiconductor fabrication equipment, temporal storage apparatuses (buffers) are provided in the vicinity of load ports of semiconductor fabrication equipment. In this regard, Patent Literature 1 (JP 2012-111635) by the applicant has proposed to provide a travelling rail for a local vehicle in parallel with and below a travelling rail for overhead travelling vehicles (overhead hoist transports (OHT)). If buffers suitable for transfer between the local vehicle and between the overhead travelling vehicles are provided at positions under the travelling rail for the local vehicle and not over the load ports, for example, four buffers may be provided. If the buffers are not sufficient in their number, then, providing the overhead travelling vehicles and the local vehicle with a lateral transfer mechanism for carriers and providing additional buffers at downward and sideway positions from the travelling rail for the local vehicle are a possible design for increasing the number of buffers.

CITATION LIST

Patent Literature

Patent Literature 1: JP 2012-111635

SUMMARY OF THE INVENTION

Problem to be Solved by the Invention

However, if the local vehicle is provided with a lateral transfer mechanism for the carriers, the height of the local vehicle increases, and the volume occupied by the temporary storage apparatus increases. Therefore, it is necessary to increase the buffering capacity for carriers without increasing the height of the local vehicle. The problem to be solved by the present invention is to increase the buffering capacity of a temporary storage apparatus without providing the local vehicle with a lateral transfer mechanism.

Means for Solving Problem

A temporary storage apparatus according to one aspect of the present invention stores carriers between overhead travelling vehicles travelling along a travelling rail and a load port of equipment, comprises:
 a local vehicle provided with a hoist for raising and lowering a carrier and configured to travel;
 a travelling rail for the local vehicle provided below the travelling rail for the overhead travelling vehicles and extending to an area over the load port;
 at least one slidable buffer configured to support a carrier thereon and slide between a position under the travelling rail for the local vehicle and a position laterally separated from the position under the travelling rail for the local vehicle; and
 a controller configured to control the local vehicle and the slidable buffer,
 wherein the travelling rail for the local vehicle extends from the area over the load port to a waiting position for the local vehicle shifted from the area over the load port, and
 wherein the local vehicle is configured to wait at the waiting position.

A method for temporarily storing carriers according to another aspect of the present invention stores carriers between overhead travelling vehicles travelling along a travelling rail and a load port of equipment with usage of a temporary storage apparatus;
 said temporary storage apparatus comprises: a local vehicle provided with a hoist for raising and lowering a carrier and configured to travel;
 a travelling rail for the local vehicle provided below the travelling rail for the overhead travelling vehicles and extending to an area over the load port;
 at least one slidable buffer configured to support a carrier thereon and to slide between a position under the travelling rail for the local vehicle and over the load port and a position laterally separated from the position under the travelling rail for the local vehicle; and
 a controller configured to control the local vehicle and the slidable buffer,
 wherein the travelling rail for the local vehicle extends from the area over the load port to a waiting position for the local vehicle shifted from the area over the load port,
 the method comprises the steps of:
 making the slidable buffer move by the controller rearward from the position under the travelling rail and over the load port to the position laterally separated, and making the overhead travelling vehicles or the local vehicle transfer a carrier between the load port;
 making the slidable buffer move by the controller forward from the position laterally separated to the positions under the travelling rail and over the load port, and making the overhead travelling vehicles or the local vehicle transfer a carrier between the slidable buffer; and
 making the local vehicle wait at the waiting position.

While an arbitrary number of slidable buffers are usable, at least one of the slidable buffers is allocated such that said position under the travelling rail is located over the load port. Preferably, for each load port, a slidable buffer configured to advance a position over the load port is provided.

With this configuration, the buffering capacity for the carriers is increased, since slidable buffers are provided at positions from which the slidable buffers may advance over the load ports. Further, the local vehicles do not need a lateral transfer mechanism. In addition, the local vehicle waits at the position separated from the area over the load port, trouble of the local vehicle does not prevent the transportation between the overhead travelling vehicles and the load port. A plurality of slidable buffers are preferably provided in a row along one side of the travelling rail for the local vehicle or preferably provided in two rows along both sides of the travelling rail for the local vehicle so that each row has plural slidable buffers. In the present specification, descriptions regarding the temporary storage apparatus for storing carriers also apply to the method for temporarily storing carriers as they are.

The controller may instruct the local vehicle to wait, or the local vehicle may autonomously move to the waiting position. The waiting position may be provided at one end of the travelling rail for the local vehicle, or at both ends thereof.

Preferably, a fixed buffer configured to support a carrier thereon is provided at a position under the travelling rail for the local vehicle, not over the load port, and including an area under the waiting position. This increases the buffering capacity further. When the fixed buffer is located at a lower position than the slidable buffer by a height corresponding to one carrier, further slidable buffer advancing toward a position over the fixed buffer may be provided.

Preferably, at the position laterally separated from the position under the travelling rail for the local vehicle, a space over the slidable buffer is open. As a result, an overhead travelling vehicle which is provided with both a hoist for raising and lowering a carrier and a lateral transfer mechanism for laterally transferring the hoist is capable of transferring a carrier between the slidable buffer by the lateral transfer mechanism and the hoist through the space. Therefore, overhead travelling vehicles provided with the lateral transfer mechanism may transfer a carrier between the slidable buffer at the position laterally separated from positions under the travelling rail for the local vehicle.

Preferably, both a slidable buffer configured to slide toward one lateral side of the travelling rail for the local vehicle and a slidable buffer configured to slide toward the other lateral side of the travelling rail are provided, and the number of the slidable buffers is increased.

Preferably, the slidable buffer comprises a base and a movable pedestal configured to move forward from the base to a position under the travelling rail for the local vehicle, said base is fixed at a position laterally separated from the position under the travelling rail for the local vehicle. A sensor configured to detect that the pedestal is located at the position under the travelling rail for the local vehicle, and a sensor configured to detect that the pedestal is located at a position over the base are provided, and said controller is configured and programmed to permit the overhead travelling vehicles and the local vehicle to transfer a carrier between the slidable buffer according to a detected position of the pedestal. As a result, the transfer of a carrier between the overhead travelling vehicle or the local vehicle and the slidable buffer may be reliably performed.

Particularly preferably, the pedestal is provided with a sensor configured to detect whether a carrier is present, and the controller is configured and programmed to permit the overhead travelling vehicles and the local vehicle to transfer a carrier between the slidable buffer depending on whether a carrier is present. Thus, errors such as a loading from a slidable buffer without a carrier and unloading to a slidable buffer already having a carrier are prevented.

BRIEF DESCRIPTION OF THE DRAWINGS

FIG. 5 is a side view schematically showing the modification with an increased storage capacity.

DETAILED DESCRIPTION OF THE PREFERRED EMBODIMENTS

The best embodiment for carrying out the present invention is described in the following. The scope of the present invention is based on the claims and is to be construed with reference to the description and well-known techniques in the field in accordance with understanding of a person skilled in the art.

Embodiment

Figure 1:
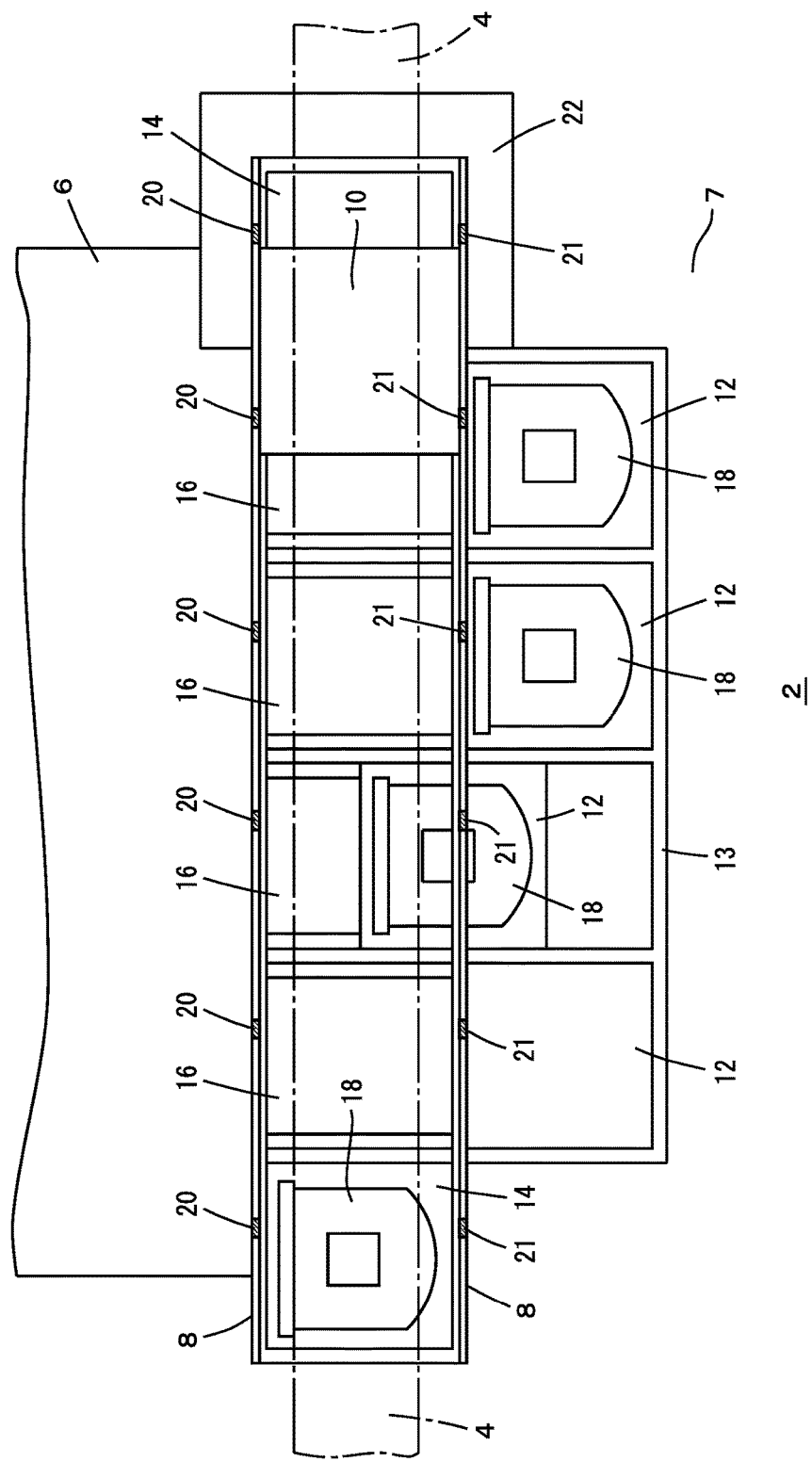
FIG. 1 is a plan view of a temporary storage apparatus for carriers according to an embodiment.
Figure 2:
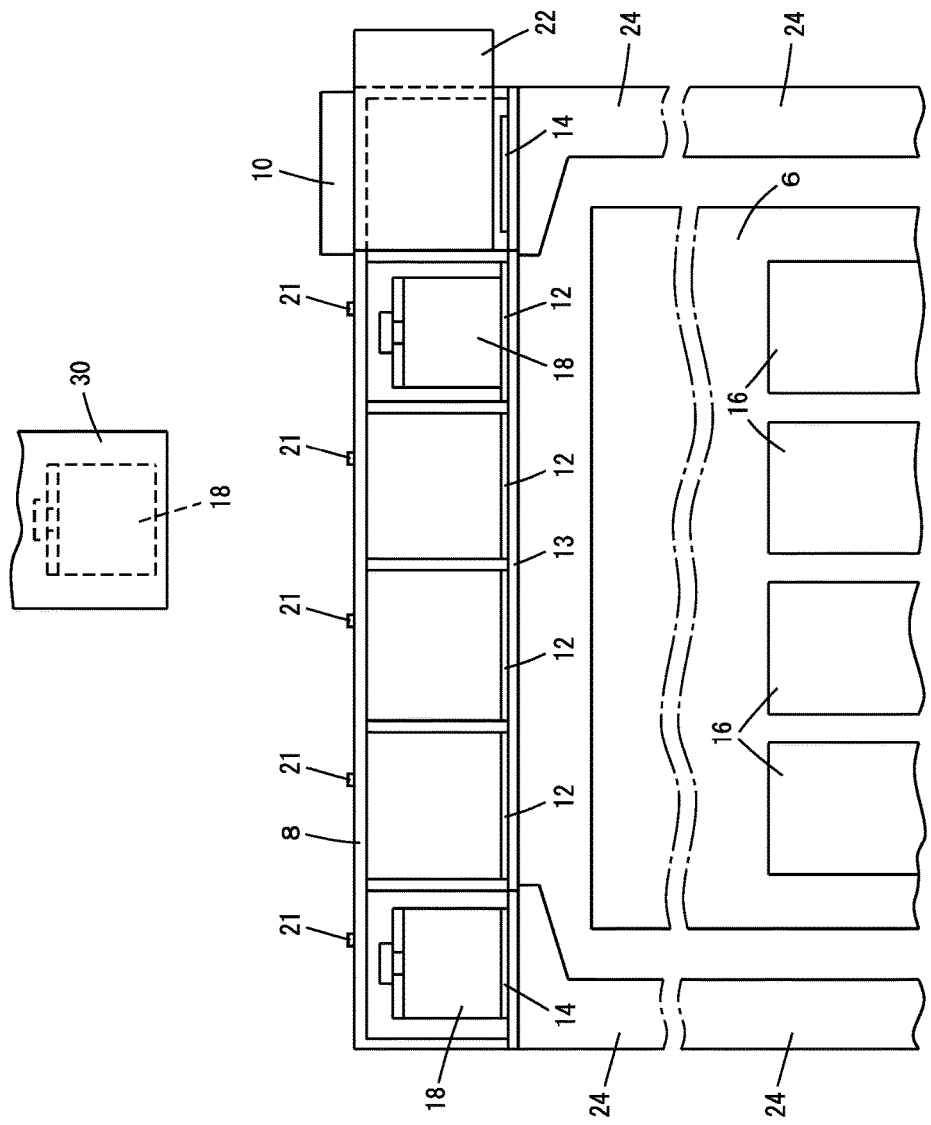
FIG. 2 is a fragmentary side view of the temporary storage apparatus for carriers according to the embodiment.
Figure 3:
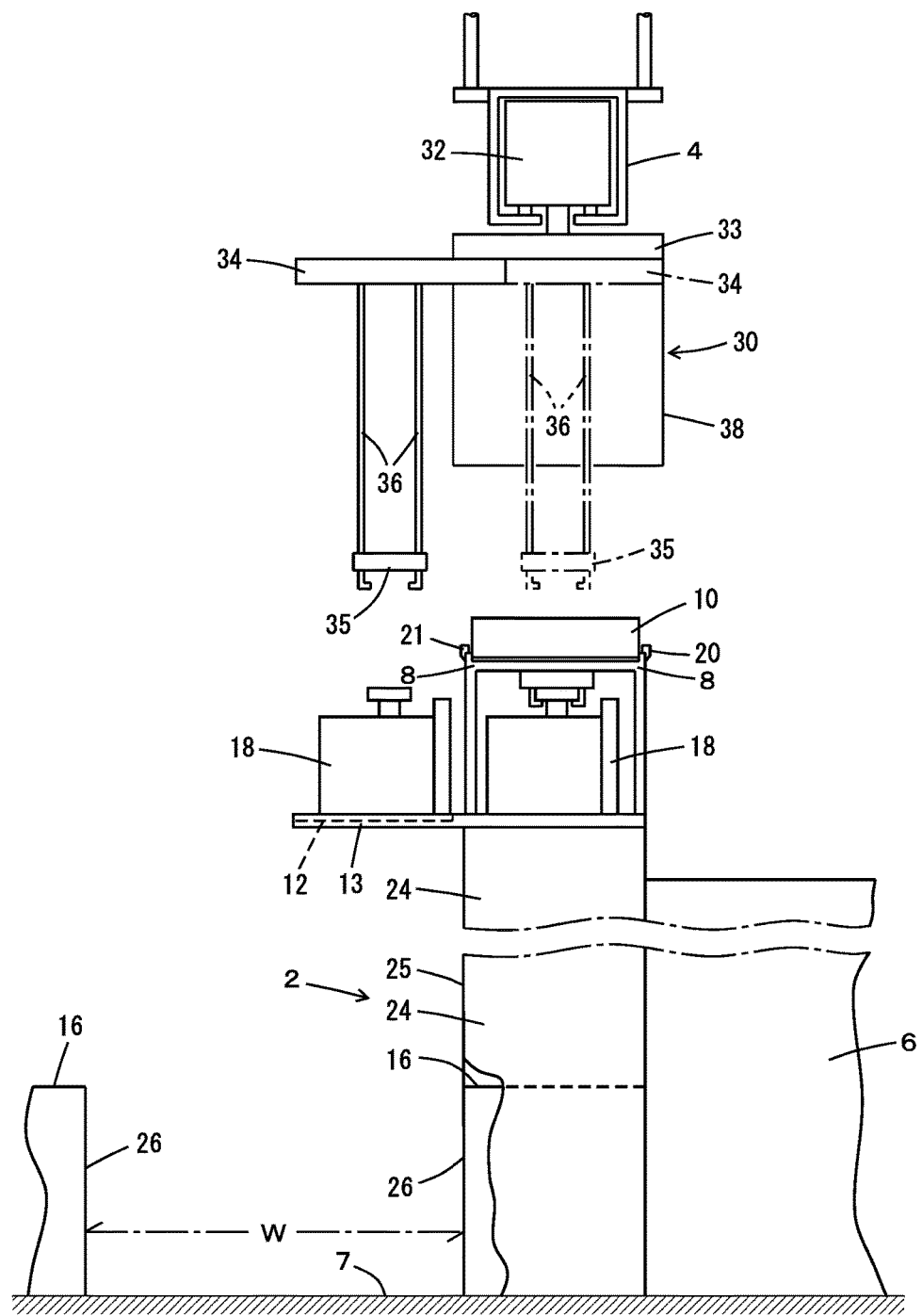
FIG. 3 is a fragmentary front view of the temporary storage apparatus for carriers according to the embodiment.

FIGS. 1 to 12 show a temporary storage apparatus 2 for carriers (a temporary storage apparatus) according to an embodiment of the invention and modifications thereof. The temporary storage apparatus 2 is provided in a cleanroom or the like, and travelling rail 4 for an overhead travelling vehicle (OHT) 30, as is shown in FIG. 3, is supported from the ceiling of the cleanroom. Reference numeral 6 indicates fabrication equipment for semiconductors or the like. The equipment includes an inspection apparatus and is provided with one or more load ports 16. Articles such as semiconductor wafers and reticles are housed in a carrier 18 such as a front-opening unified pod (FOUP), the carrier is temporarily stored on slidable buffers 12 and fixed buffers 14 and is transported by the overhead travelling vehicle (OHT) 30 and a local vehicle 10.

The temporary storage apparatus 2 is provided over a passage 7 in the cleanroom at a height without interference with people. On the uppermost part of the temporary storage apparatus 2, the local vehicle 10 travels along a pair of travelling rails 8,8 over the row of load ports 16 in parallel with the equipment 6. There is a gap between the travelling rails 8,8 for passing the carrier 18, and the overhead travelling vehicles 30 and the local vehicle 10 transfer the carrier 18 through the gap between the travelling rails 8,8.

The slidable buffers 12 are supported by a frame 13 of the temporary storage apparatus 2, at positions corresponding to the load ports 16 and so on, for example, at positions shifted sideways from an area over the load ports 16. Preferably, a plurality of slidable buffers 12 are supported in a row or in rows; however, only one slidable buffer 12 may be provided. The slidable buffers 12 are configured to move back and forth between a forward position under the travelling rails 8,8, and, for example, over the load ports 16 and a rearward position laterally separated from the position under the travelling rails 8,8. Preferably, in addition to the slidable buffers 12, at least a fixed buffer 14 is provided at one end or both ends of the travelling rails 8,8. Positions over the load ports 16 and positions over the fixed buffers 14 are stop positions for the local vehicle 10 and the overhead travelling vehicles 30, and the positions over the fixed buffers 14 also serve as waiting positions for the local vehicle 10. Note that slidable buffers 12 may be provided in place of the fixed buffers 14 to omit the fixed buffers 14. Positions not over the load ports 16 are allocated as waiting positions for the local vehicle 10. Therefore, a problem with the local vehicle 10 will not prevent the transfer between the load ports 16 and the overhead travelling vehicles 30.

Figure 10:
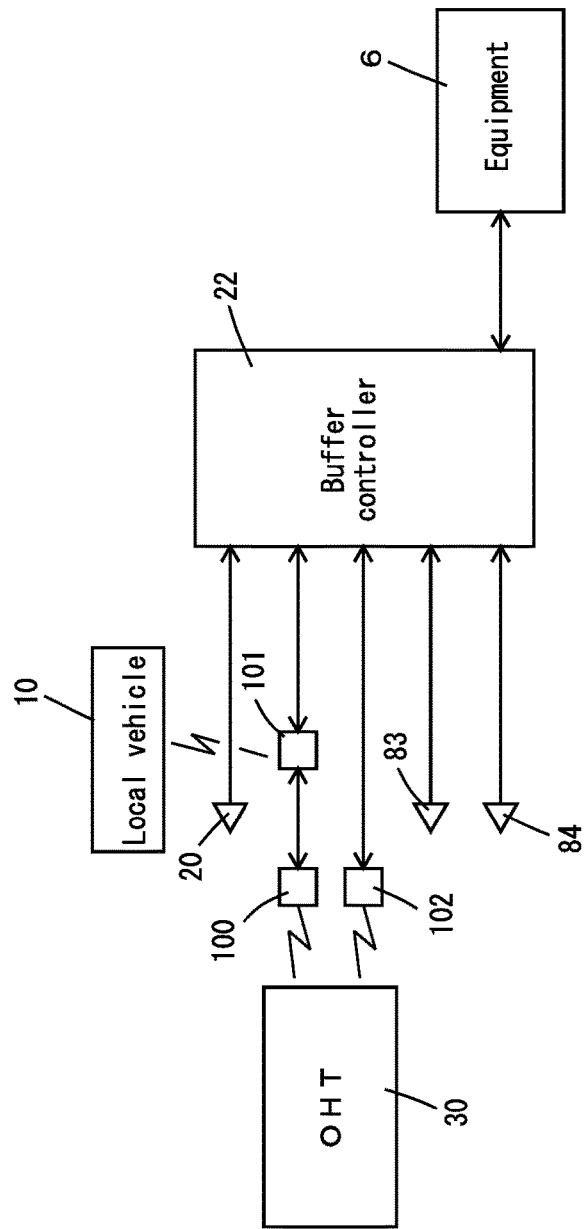
FIG. 10 is a block diagram showing an interlock mechanism according to the embodiment.

The stop positions for the local vehicle 10 and the overhead travelling vehicles 30 correspond one-to-one to the load ports 16 or the fixed buffers 14. Note that the stop positions corresponding to the load ports 16 also serve as stop positions corresponding to the slidable buffers 12. Terminals 100 to 102 shown in FIG. 10 are provided at each stop position and establish interlock between the transfer by the overhead travelling vehicles 30 and the entrance of the local vehicle 10. Reference numerals 20 and 21 respectively indicate an optical sensor and a reflection plate, both provided at each stop position. The optical sensor 20 detects an elevation platform lowered from the overhead travelling vehicle 30, a belt suspending the elevation platform, or a carrier held by the elevation platform, when the light path between the optical sensor 20 and the reflection plate 21 is blocked. Reference numeral 22 indicates a buffer controller that controls the local vehicle 10 and the slidable buffers 12, establishes interlock between the overhead travelling vehicle 30 and the local vehicle 10, and communicates with the equipment 6.

As shown in FIGS. 2 and 3, the temporary storage apparatus 2 is supported by a pair of trestles 24 that have a gate-like shape. Front faces 25 of the trestles 24 toward the passage 7 are located, relative to the passage 7, at approximately the same position as front faces 26 of the load ports 16 or closer to the equipment 6 than the front faces 26. Therefore, the width W of the passage 7 is dependent on the positions of the load ports 16, and temporary storage apparatus 2 does not make the width W of the passage 7 narrower. "Approximately the same" means that the difference between the front faces is up to ±100 mm, particularly up to ±50 mm, and preferably the front faces 25 and 26 are located at substantially the same position. The temporary storage apparatus 2 may be suspended from the ceiling of the cleanroom or from the travelling rail 4 for the overhead travelling vehicles 30. However, it is easy to transport, install, and position the temporary storage apparatus 2 supported by the trestles 24 into the cleanroom. The trestles 24 having the front faces 25 not protruding toward the passage 7 over the load ports 16 do not make the passage narrower.

The structure of the overhead travelling vehicles 30 is shown in FIG. 3. A travelling unit 32 travels in the travelling rail 4 and also supports a lateral transfer mechanism 33 which laterally moves a raising and lowering drive 34 in a horizontal direction orthogonal to the travelling rail 4. The raising and lowering drive 34 feeds and winds up suspenders such as belts 36 to raise and lower an elevation platform 35 that holds and releases a carrier 18. A hoist comprises the raising and lowering drive 34, the elevation platform 35, and the belts 36. The optical sensor 20 already described detects the hoist and the carrier supported by the hoist. Reference numeral 38 indicates an anti-fall hood that prevents the carrier 18 from falling. In addition, a mechanism for rotating the raising and lowering drive 34 about a vertical axis may also be provided. For an overhead travelling vehicle without the lateral transfer mechanism 33, the slidable buffers 12 move forward to positions under the travelling rails 8,8.

Figure 4:
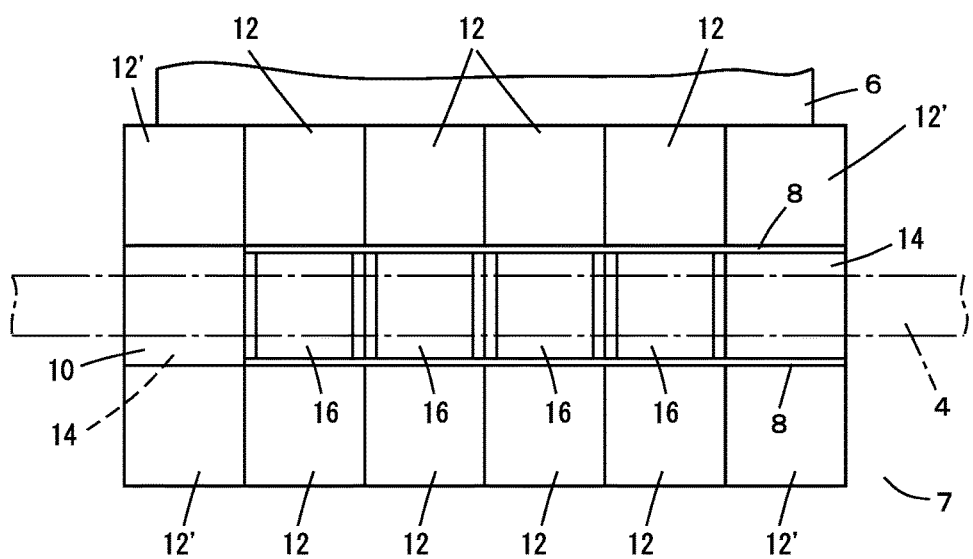
FIG. 4 is a plan view schematically showing a modification with an increased storage capacity.

The temporary storage apparatus 2 shown in FIGS. 1 to 3 is provided with four slidable buffers 12 and two fixed buffers 14, and the equipment 6 is provided with four load ports 16, for example. A temporary storage apparatus 40 with maximum capacity for storing carriers 18 and serving the four load ports 16 is shown in FIGS. 4 and 5. In the temporary storage apparatus 40, the fixed buffers 14 are located at positions lower than the slidable buffers 12 by a height corresponding to one carrier (FIG. 5), and consequently the occupation height of the temporary storage apparatus 40 is made larger. The slidable buffers 12 are provided on both sides of the travelling rails 8,8, and further slidable buffers 12' are provided at positions above the fixed buffers 14 and shifted from the load ports 16 so that they move forward over the fixed buffer. As a result, eight slidable buffers 12, four slidable buffers 12' separated from the load ports 16, and two fixed buffers 14 are provided, and positions over the fixed buffers 14 are the waiting positions for the local vehicle 10.

Figure 6:
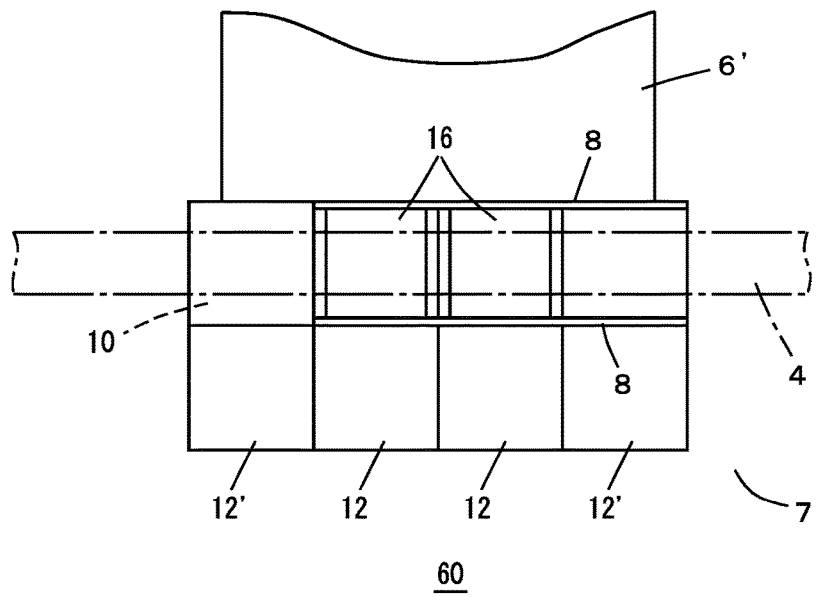
FIG. 6 is a plan view schematically showing another modification for small equipment.

FIG. 6 shows a temporary storage apparatus 60 for small equipment 6' with a smaller storage capacity. The equipment 6' is provided with two load ports 16, and the temporary storage apparatus 60 is provided with four slidable buffers. Positions over the slidable buffers 12' separated from the load ports 16 are the waiting positions for the local vehicle 10. While a structure similar to that shown in FIG. 5 allows two additional fixed buffers 14, it increases the height of the temporary storage apparatus 60.

Figure 7:
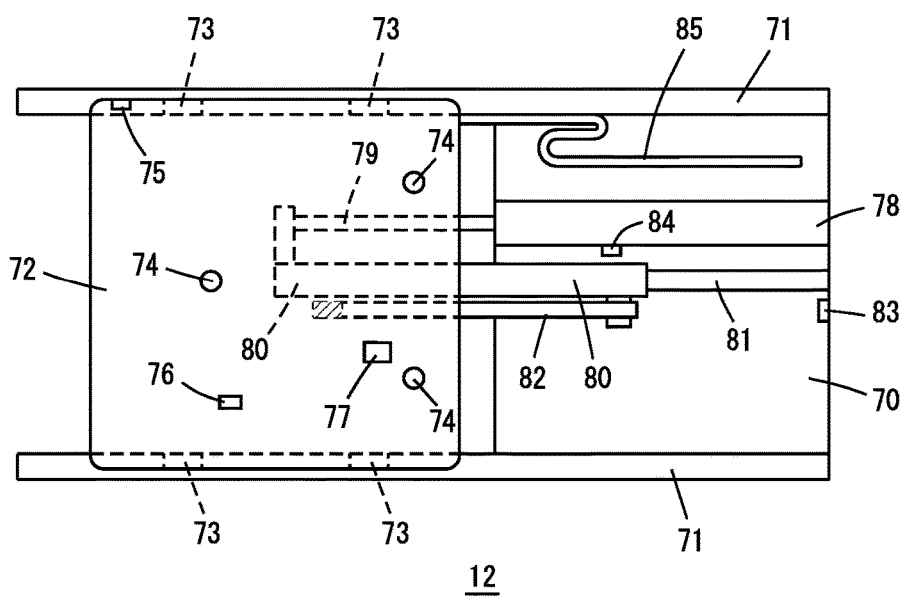
FIG. 7 is a plan view of a slidable buffer.

FIG. 7 shows the structure of the slidable buffer 12. Reference numeral 70 indicates a base fixed to the frame of the temporary storage apparatus, and a pedestal 72 moves back and forth between a forward position and a rearward position along rails 71 by wheels 73. The forward position is a position under the travelling rails for the local vehicle and, for example, over the load ports 16. The rearward position is laterally separated from the forward position. For example, three positioning pins 74 provided on the pedestal 72 position the bottom portion of the carrier 18. A carrier sensor 75 detects whether the carrier 18 is present, a seating sensor 76 detects whether the carrier 18 is seated at a correct position over the positioning pins 74, and an ID reader 77 reads the ID of the carrier. The ID reader 77 may be omitted, and both the sensors 75, 76 and the ID reader 77 are provided for the fixed buffers in the same manner.

A linear guide 80 is moved back and forth along a rail 81 by a cylinder 78 such as a pneumatic cylinder or a hydraulic cylinder and a piston 79 or by a motor and a toothed belt or the like (not shown). The pedestal 72 is moved back and forth by a double speed mechanism comprising a toothed belt 82 and so on, at twice the stroke of the linear guide 80. The double speed mechanism has been widely used in slide forks, and another mechanism may be adopted to move the pedestal 72 back and forth. A sensor 83 detects that the linear guide 80 is at a rearward position, and a sensor 84 detects that the linear guide 80 is at a forward position. A cable guide 85 guides a power supply line and a signal line bendably and connects the sensors 75, 76 and the ID reader 77 to the base 70. The sensors 83 and 84 act to detect the positions of the pedestal 72, and the rails 71 may be provided with, for example, an optical sensor for detecting the front end position of the pedestal and an optical sensor for detecting the rear end position of the pedestal.

Figure 8:
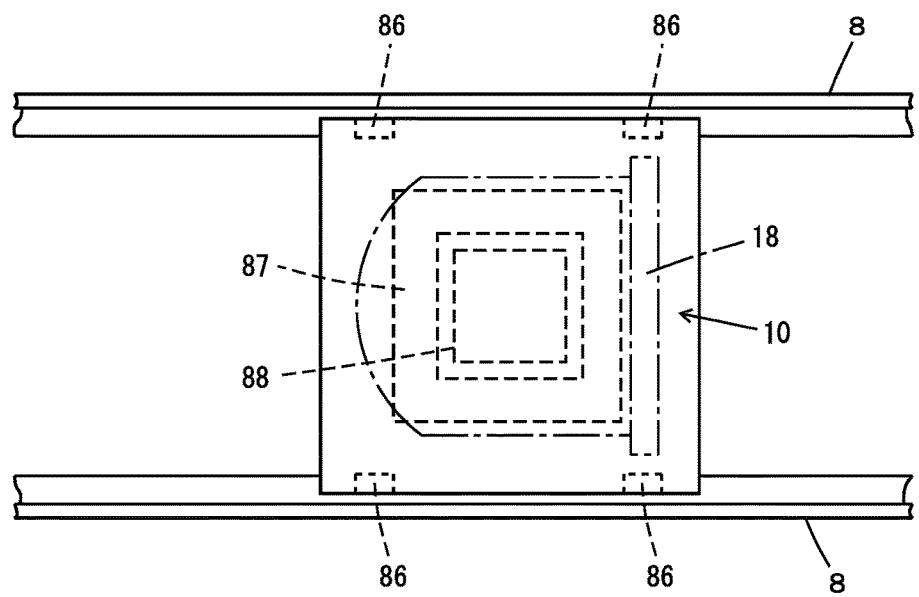
FIG. 8 is a plan view of a local vehicle.

FIG. 8 shows the structure of the local vehicle 10. The local vehicle 10 travels along the pair of travelling rails 8,8 by wheels 86 and a motor (not shown) and raises and lowers an elevation platform 88 that holds and releases the carrier 18 by a raising and lowering drive 87, belts (not shown), and so on. In addition to them, the local vehicle 10 is further provided with a communication device to communicate with the buffer controller 22, another communication device to communicate with a terminal 30 for interlock between the overhead travelling vehicle, a power supply such as a battery, and an on-board controller.

Figure 9:
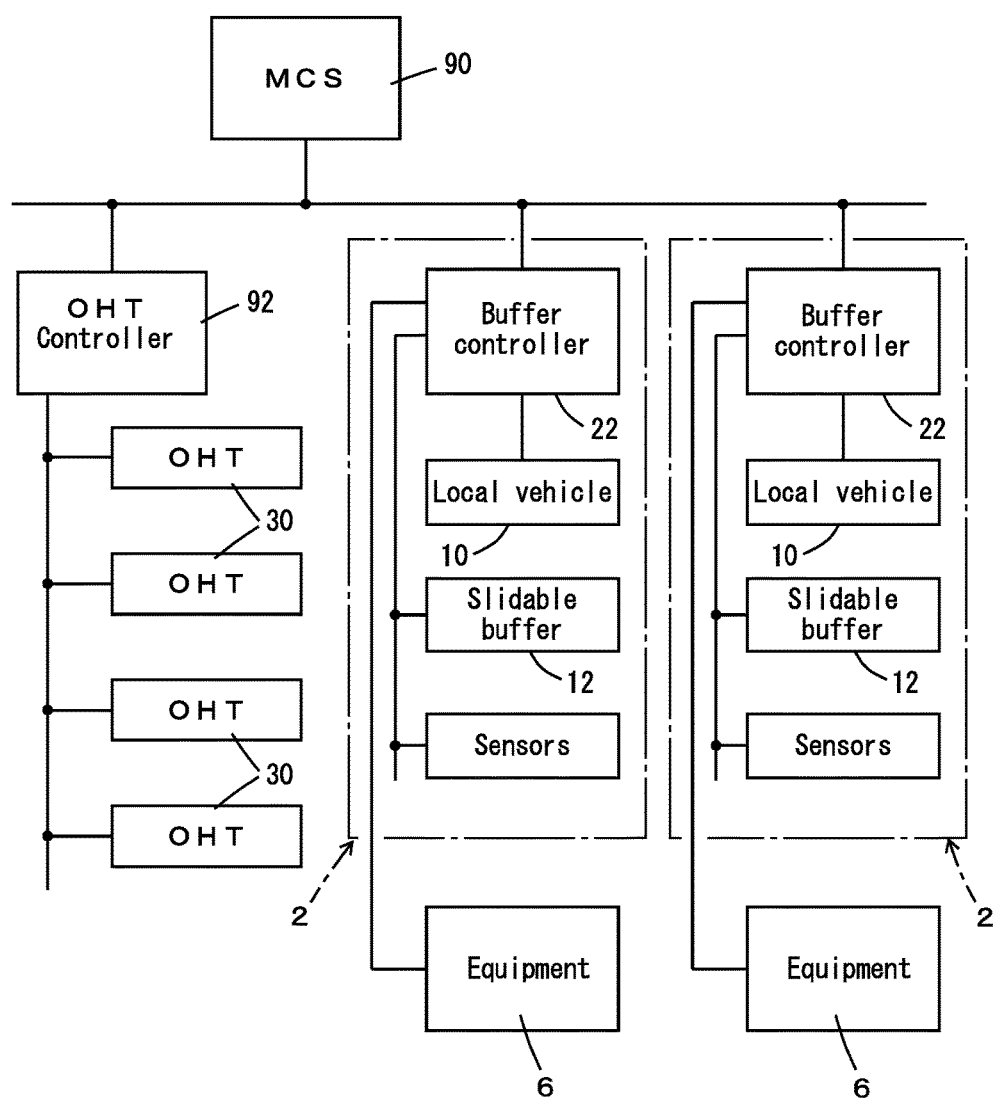
FIG. 9 is a block diagram showing a control system for local vehicles and overhead travelling vehicles according to the embodiment.

FIG. 9 shows the temporary storage apparatuses 2 and control systems in the environment. A material control system (MCS) 90 communicates with a host controller (not shown) or the like, receives requests regarding the transport of carriers, and instructs an OHT controller 92 and the buffer controllers 22 to transport the carriers. The OHT controller 92 instructs a plurality of overhead travelling vehicles 30 to transport the carriers. The buffer controllers 22 instruct the local vehicles 10 to transport the carriers and control the back and forth movement of the slidable buffers 12. The buffer controllers 22:

detect the states of the temporary storage apparatuses 2 (the presence or absence of a carrier in each buffer and the position of each slidable buffer 12) by the optical sensor 20, the sensors 75 and 76, the ID reader 77, the sensors 83 and 84, terminals described later, and so on; and establish the interlock between the overhead travelling vehicles 30 and the local vehicles 10.

FIG. 10 shows an interlock mechanism between an overhead travelling vehicle 30 and a local vehicle 10. The optical sensor 20 detects the hoist of the overhead travelling vehicle 30, such as the belt and the elevation platform, or detects a carrier raised or lowered by the overhead travelling vehicle 30. Thus, the optical sensor 20 can detect that the overhead travelling vehicle 30 is transferring a carrier, as well as the stop position of the overhead travelling vehicle 30.

When the overhead travelling vehicle 30 transfers a carrier between a load port under the travelling rail, a fixed buffer, or a slidable buffer at a forward position under the travelling rails, the overhead travelling vehicle 30 requests the buffer controller 22 for transfer permission via the terminal 100. When the local vehicle 10 transfers a carrier between these positions, the local vehicle 10 requests the buffer controller 22 for transfer permission via the terminal 101.

The buffer controller 22 detects the position of the slidable buffer according to signals from the sensors 83 and 84 and checks whether a carrier is present in the slidable buffer or the fixed buffer. Then, if the transfer is possible, the buffer controller 22 permits the request. The buffer controller 22 also communicates with the equipment 6, forwards a request for the transfer of a carrier between a load port and the overhead travelling vehicle 30 or the local vehicle 10, and receives a permission signal from the equipment 6. Based on the above process, the buffer controller 22 transmits transfer permission to the overhead travelling vehicle 30 and the local vehicle 10 via the terminals 100 and 101. The transfer permission signals of the buffer controller 22 are set in the terminals 100 and 101, and the overhead travelling vehicle 30 and the local vehicle 10 perform transfer after checking the transfer permission.

The transfer processes by the local vehicle 10 and the overhead travelling vehicle 30 have been described, and transfer by the overhead travelling vehicle 30 may conflict with the entrance of the local vehicle 10. Therefore, the local vehicle 10 requests the buffer controller 22 via the terminal 101 for permission for each of the stop positions that the local vehicle 10 enters in advance. If there is no interference with transfer by the overhead travelling vehicle 30, the buffer controller 22 permits the request for entrance of the local vehicle 10 for each stop position. After checking the entrance permission signal via the terminal 101, the local vehicle 10 enters the permitted stop position.

The overhead travelling vehicle 30 can transfer a carrier between a slidable buffer located at the rearward position (a position not under the travelling rails for the local vehicle 10) by the lateral transfer device. This transfer does not interfere with the travelling of the local vehicle 10 nor the transfer by the local vehicle 10. In this case, the overhead travelling vehicle 30 requests the buffer controller 22 via the terminal 102 for transfer permission, and the buffer controller 22 permits the request if the required slidable buffer is ready to be transferred.

There may be interference between transfer between the load port and the fixed buffer by the overhead travelling vehicle 30 and the entrance (travelling) of the local vehicle 10, and this is avoidable by establishing the interlock via the terminals 100 and 101. Even if interlock established via the terminal 100 might not suffice, interference between the local vehicle 10 and the overhead travelling vehicle 30 is avoidable by detecting the belt, the elevation platform of the overhead travelling vehicle 30, carriers, and so on. Regarding transfer between the slidable buffer at the rearward position and the overhead travelling vehicle 30, the interlock may be established via the terminal 102. Furthermore, the buffer controller 22 may detect the position of the slidable buffer by the sensors 83 and 84.

These interlocks may be dealt with by a controller other than the buffer controller 22. If the buffer controller 22 has been notified by the local vehicle 10 of its position, the buffer controller 22 may request a built in interlock processing unit for entrance permission for the local vehicle 10 and may permit by itself to enter, without the communication between the terminal 101 and the local vehicle 10.

When no transport nor transfer of a carrier is instructed, the local vehicle 10 moves to a waiting position located over the fixed buffers 14 according to an instruction from the buffer controller 22 and waits.

Figure 11:
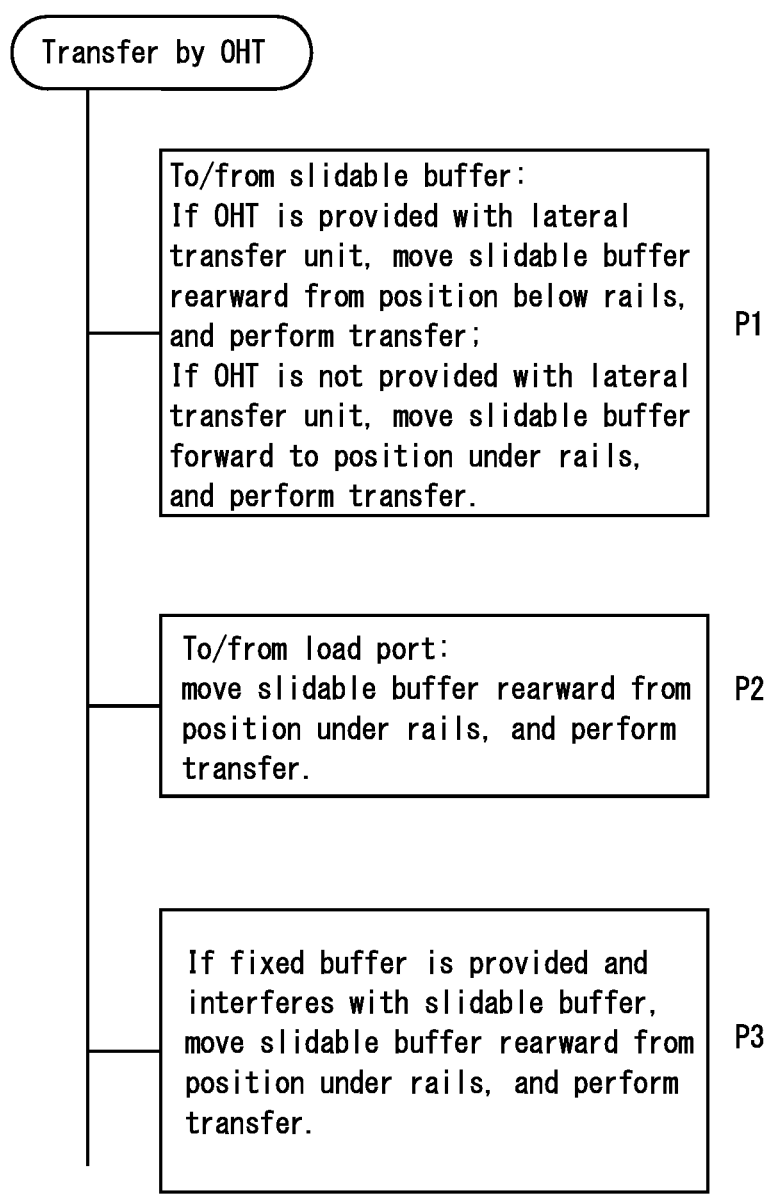
FIG. 11 is a diagram showing a transfer algorithm of overhead travelling vehicles according to the embodiment.

FIG. 11 shows a transfer algorithm of an overhead travelling vehicle to transfer between the temporary storage apparatus. Regarding transfer between a slidable buffer (process P1) and the overhead travelling vehicle provided with the lateral transfer device, the slidable buffer moves rearward from a position under the travelling rails, and the transfer is performed at a rearward position without interference with the local vehicle. For the overhead travelling vehicle not provided with the lateral transfer device, the slidable buffer moves forward to a position under the travelling rails, and the transfer is performed at this position. Interlock in this case is the same as that for transfer between a load port.

Regarding transfer between a load port (process P2), the slidable buffer moves rearward from the position under the travelling rails 8,8 shown in FIG. 1, and the transfer is performed. Regarding transfer between a fixed buffer (process P3), if a slidable buffer is present over the fixed buffer as shown in FIG. 5, the slidable buffer moves rearward from the position over the fixed buffer, and the transfer is performed.

Figure 12:
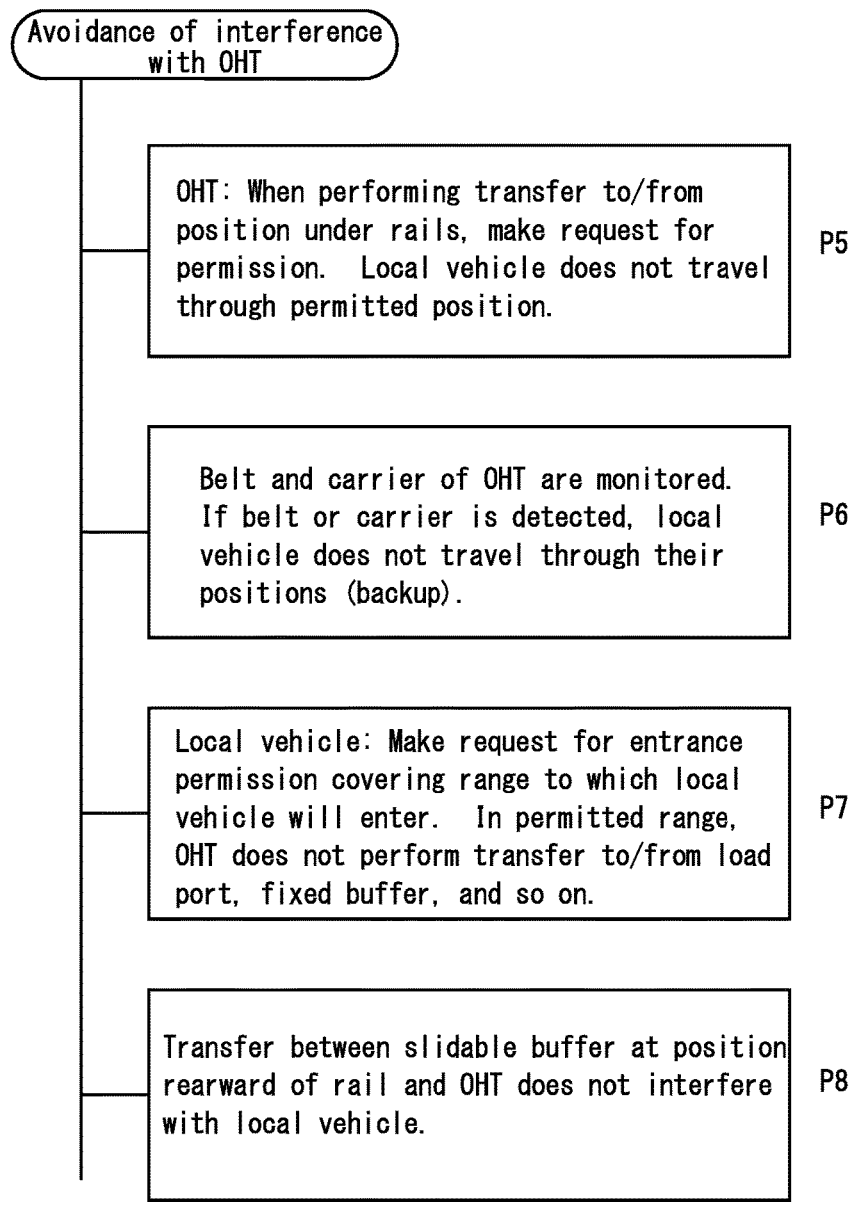
FIG. 12 is a diagram showing an algorithm for avoiding interference between an overhead travelling vehicle and a local vehicle according to the embodiment.

FIG. 12 shows an algorithm for avoiding interference between an overhead travelling vehicle and a local vehicle. When transferring a carrier between a slidable buffer located under the travelling rails for the local vehicle, a load port, or a fixed buffer, the overhead travelling vehicle (OHT) requests for transfer permission via a terminal in advance.

The local vehicle requests for entrance permission for each of the stop positions to enter and makes a further request for transfer permission for transfer in addition to the entrance permission. For the same stop position, only one request out of the transfer request from the overhead travelling vehicle and the entrance request from the local vehicle may be permitted, and the interference between the overhead travelling vehicle and the local vehicle is avoided (process P5).

If an error within an overhead travelling vehicle occurs after the start of transfer between a load port and so on, in some cases the overhead travelling vehicle may not transmit to the terminal a signal indicating the transfer being performed. In this situation, the buffer controller might be unable to recognize that the overhead travelling vehicle is performing transfer. This problem may be solved by making the buffer controller store in a non-volatile memory the information that the overhead travelling vehicle is performing transfer, however, this problem may be more reliably solved by detecting the hoist of the overhead travelling vehicle, a carrier raised or lowered, or the like by the optical sensors 20 shown in FIG. 1. Therefore, if the hoist or the like is detected, the entrance of the local vehicle to the detected stop position is prohibited (process P6).

The local vehicle is configured and programmed to make a request for entrance for each of the stop positions. The buffer controller is configured and programmed not to permit transfer by the overhead travelling vehicle regarding positions already permitted to enter to the local vehicle (process P7). Note that regarding transfer between slidable buffers not under the travelling rails 8,8 shown in FIG. 1, no interference will occur with the local vehicle. Therefore, the interference avoidance process is not necessary (process P8).

Figure 13:
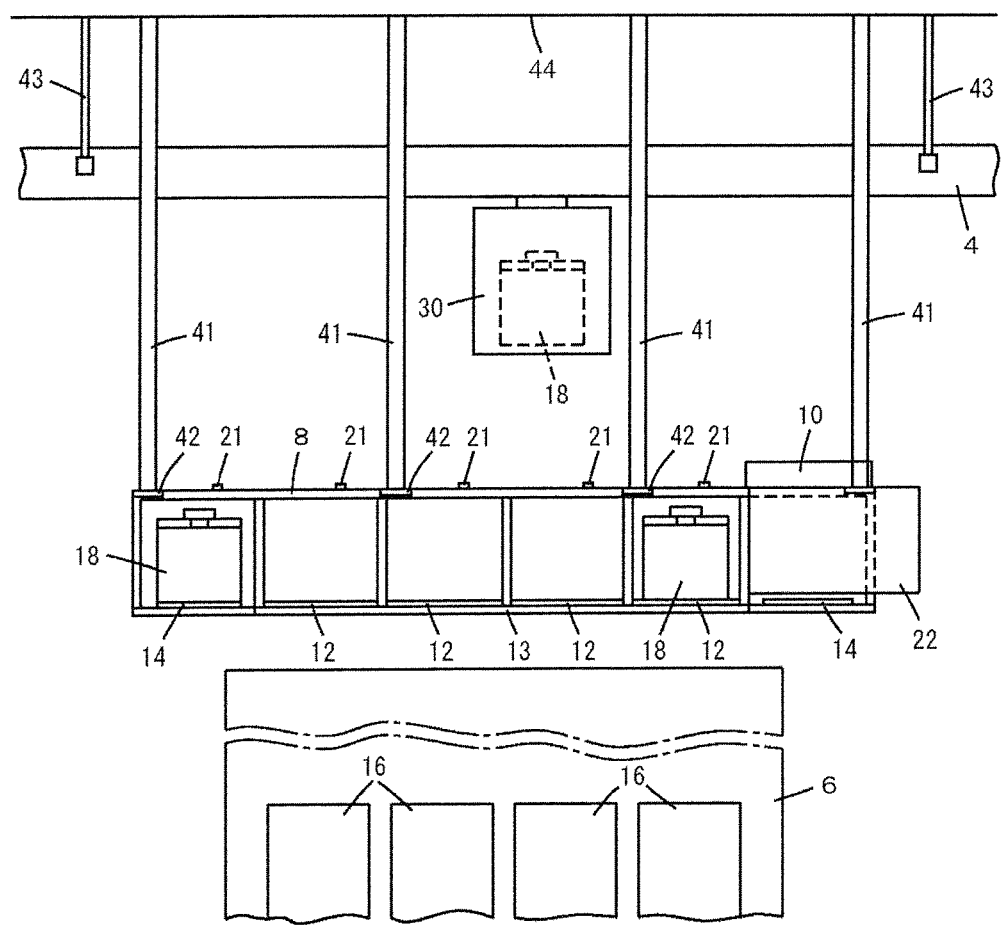
FIG. 13 is a fragmentary side view of a modification in which a temporary storage apparatus for carriers is supported from a ceiling.

As shown in FIG. 13, the temporary storage apparatus 2 may be supported from a ceiling 44 of the cleanroom by pillars 41 and connection portions 42, and the trestles 24 may be omitted. Reference numeral 43 denotes a pillar of the travelling rails 4 for the overhead travelling vehicle 30.

LIST OF REFERENCE NUMERALS 2, 40, 60 temporary storage apparatus for storing carriers (temporary storage apparatus)
4: travelling rail for overhead travelling vehicles
6: equipment
7: passage
8: travelling rail for local vehicles
10: local vehicle
12: slidable buffer
13: frame
14: fixed buffer
16: load port
18: carrier
20: optical sensor
21: reflection plate
22: buffer controller (controller)
24: trestle
25, 26: front face
30: overhead travelling vehicle (OHT)
32: travelling section
33: lateral transfer mechanism
34: raising and lowering drive
35: elevation platform
36: belt
38: anti-fall hood
44: ceiling
41, 43: pillar
42: connection portion
70: base
71: rail
72: pedestal
73: wheel
74: positioning pin
75: carrier sensor
76: seating sensor
77: ID reader
78: cylinder
79: piston
80: linear guide
81: rail
82: toothed belt
83, 84: sensor
85: cable guide
86: wheel
87: raising and lowering drive
88: elevation platform
90: material control system (MCS)
92: OHT controller
100 to 102: terminal

What is claimed is:

1. A temporary storage apparatus temporarily storing carriers between overhead travelling vehicles travelling along a travelling rail and a load port of equipment, comprising:
   a local vehicle provided with a hoist for raising and lowering a carrier and configured to travel;
   a travelling rail for the local vehicle provided below the travelling rail for the overhead travelling vehicles and extending to an area over the load port;
   at least one slidable buffer configured to support a carrier thereon and slide between a position under the travelling rail for the local vehicle and a position laterally separated from the position under the travelling rail for the local vehicle; and
   a controller configured to control the local vehicle and the slidable buffer,
   wherein the travelling rail for the local vehicle extends from the area over the load port to a waiting position for the local vehicle shifted from the area over the load port,
   wherein the local vehicle is configured to wait at said waiting position,
   wherein the slidable buffer comprises a movable pedestal configured to move forward from a base to a position under the travelling rail for the local vehicle,
   wherein a sensor is configured to detect that the pedestal is located at the position under the travelling rail for the local vehicle and a sensor is configured to detect that the pedestal is located at a position over the base are provided, and
   wherein said controller is configured and programmed to permit the overhead travelling vehicles and the local vehicle to transfer a carrier between the slidable buffer according to a detected position of the pedestal.

2. The temporary storage apparatus according to claim 1, wherein said slidable buffer includes a slidable buffer of which said position under the travelling rail is located over the load port.

3. The temporary storage apparatus according to claim 2, further comprising
   a fixed buffer configured to support a carrier thereon and provided at a position under the travelling rail for the local vehicle, not over the load port, and including an area under said waiting position.

4. The temporary storage apparatus according to claim 1, wherein, at said position laterally separated from the position under the travelling rail for the local vehicle, a space over said slidable buffer is made open, and wherein an overhead travelling vehicle which is provided with both a hoist for raising and lowering a carrier and a lateral transfer mechanism for laterally transferring the hoist is capable of transferring a carrier between the slidable buffer by the lateral transfer mechanism and the hoist through said space made open.

5. The A temporary storage apparatus temporarily storing carriers between overhead travelling vehicles travelling along a travelling rail and a load port of equipment, comprising:

a local vehicle provided with a hoist for raising and lowering a carrier and configured to travel;

a travelling rail for the local vehicle provided below the travelling rail for the overhead travelling vehicles and extending to an area over the load port;

at least one slidable buffer configured to support a carrier thereon and slide between a position under the travelling rail for the local vehicle and a position laterally separated from the position under the travelling rail for the local vehicle; and a controller configured to control the local vehicle and the slidable buffer, wherein the travelling rail for the local vehicle extends from the area over the load port to a waiting position for the local vehicle shifted from the area over the load port, wherein the local vehicle is configured to wait at said waiting position, and wherein said slidable buffer comprises a slidable buffer configured to slide toward one lateral side of the travelling rail for the local vehicle and a slidable buffer configured to slide toward the other lateral side of the travelling rail.

6. A temporary storage apparatus temporarily storing carriers between overhead travelling vehicles travelling along a travelling rail and a load port of equipment, comprising:

a local vehicle provided with a hoist for raising and lowering a carrier and configured to travel;

a travelling rail for the local vehicle provided below the travelling rail for the overhead travelling vehicles and extending to an area over the load port;

at least one slidable buffer configured to support a carrier thereon and slide between a position under the travelling rail for the local vehicle and a position laterally separated from the position under the travelling rail for the local vehicle; and a controller configured to control the local vehicle and the slidable buffer, wherein the travelling rail for the local vehicle extends from the area over the load port to a waiting position for the local vehicle shifted from the area over the load port, wherein the local vehicle is configured to wait at said waiting position, wherein the slidable buffer comprises a base and a movable pedestal configured to move forward from the base to a position under the travelling rail for the local vehicle, wherein said base is fixed at a position laterally separated from the position under the travelling rail for the local vehicle, wherein a sensor is configured to detect that the pedestal is located at the position under the travelling rail for the local vehicle and a sensor is configured to detect that the pedestal is located at a position over the base are provided, and wherein said controller is configured and programmed to permit the overhead travelling vehicles and the local vehicle to transfer a carrier between the slidable buffer according to a detected position of the pedestal.

7. The temporary storage apparatus according to claim 6, wherein the pedestal is provided with a sensor configured to detect whether a carrier is present, and wherein the controller is configured and programmed to permit the overhead travelling vehicles and the local vehicle to transfer a carrier between the slidable buffer depending on whether a carrier is present.

8. A method for temporarily storing carriers, between overhead travelling vehicles travelling along a travelling rail and a load port of equipment, with usage of a temporary storage apparatus;

said temporary storage apparatus comprising:

a local vehicle provided with a hoist for raising and lowering a carrier and configured to travel;

a travelling rail for the local vehicle provided below the travelling rail for the overhead travelling vehicles and extending to an area over the load port;

at least one slidable buffer configured to support a carrier thereon and to slide between a position under the travelling rail for the local vehicle and over the load port and a position laterally separated from the position under the travelling rail for the local vehicle; and a controller configured to control the local vehicle and the slidable buffer, wherein the travelling rail for the local vehicle extends from the area over the load port to a waiting position for the local vehicle shifted from the area over the load port, the method comprising the steps of:

making the slidable buffer move by the controller rearward from the position under the travelling rail and over the load port to the position laterally separated, and making the overhead travelling vehicles or the local vehicle transfer a carrier between the load port;

making the slidable buffer move by the controller forward from the position laterally separated to the positions under the travelling rail and over the load port, and making the overhead travelling vehicles or the local vehicle transfer a carrier between the slidable buffer; and making the local vehicle wait at the waiting position, wherein the slidable buffer comprises a movable pedestal configured to move forward from a base to a position under the travelling rail for the local vehicle, wherein a sensor is configured to detect that the pedestal is located at the position under the travelling rail for the local vehicle and a sensor is configured to detect that the pedestal is located at a position over the base are provided, and wherein said controller is configured and programmed to permit the overhead travelling vehicles and the local vehicle to transfer a carrier between the slidable buffer according to a detected position of the pedestal.

* * * * *